(12) United States Patent
Ro et al.

(10) Patent No.: US 7,388,740 B2
(45) Date of Patent: Jun. 17, 2008

(54) FOIL FOR NEGATIVE ELECTRODE OF CAPACITOR AND PROCESS FOR PRODUCING THE SAME

(75) Inventors: Akinori Ro, Osaka (JP); Zenya Ashitaka, Osaka (JP)

(73) Assignee: Toyo Aluminium Kabushiki Kaisha, Osaka (JP)

( * ) Notice: Subject to any disclaimer, the term of this patent is extended or adjusted under 35 U.S.C. 154(b) by 280 days.

(21) Appl. No.: 10/549,309

(22) PCT Filed: Nov. 27, 2003

(86) PCT No.: PCT/JP03/15199

§ 371 (c)(1),
(2), (4) Date: Sep. 16, 2005

(87) PCT Pub. No.: WO2004/088690

PCT Pub. Date: Oct. 14, 2004

(65) Prior Publication Data
US 2006/0171102 A1    Aug. 3, 2006

(30) Foreign Application Priority Data
Mar. 31, 2003    (JP) ............................. 2003-092983

(51) Int. Cl.
*H01G 9/00*    (2006.01)

(52) U.S. Cl. ...................... 361/523; 361/525; 361/528; 361/529; 361/516; 361/519; 29/25.01; 29/25.03

(58) Field of Classification Search ................ 361/532, 361/523–525, 528–530, 534, 516–519; 29/25.01, 29/25.03
See application file for complete search history.

(56) References Cited

U.S. PATENT DOCUMENTS

| 5,949,637 A * | 9/1999 | Iwaida et al. ................ 361/502 |
| 6,262,879 B1 * | 7/2001 | Nitta et al. .................. 361/517 |
| 6,310,765 B1 * | 10/2001 | Tanahashi et al. ........... 361/516 |
| 7,289,313 B2 * | 10/2007 | Takeda et al. .............. 361/523 |
| 2006/0172134 A1 * | 8/2006 | Ro et al. ..................... 428/408 |

FOREIGN PATENT DOCUMENTS

| JP | 52-138440 A | 11/1977 |
| JP | 4-62820 A | 2/1992 |
| JP | 4-71213 A | 3/1992 |
| JP | 4-196208 A | 7/1992 |
| JP | 5-247609 A | 9/1993 |
| JP | 2000-12400 A | 1/2000 |
| JP | 2000-299258 A | 10/2000 |
| JP | 2002-60966 A | 2/2002 |

* cited by examiner

*Primary Examiner*—Nguyen T. Ha
(74) *Attorney, Agent, or Firm*—Birch, Stewart, Kolasch & Birch, LLP

(57) ABSTRACT

Provided are a foil for a cathode of a capacitor, which can secure both a high capacitance and a high strength, and a manufacturing method thereof. The foil for a cathode of a capacitor includes an aluminum foil and a carbon-containing layer formed on a surface of the aluminum foil. An interposition layer containing aluminum and carbon is formed between the aluminum foil and the carbon-containing layer. The manufacturing method of a foil for a cathode of a capacitor includes a step of arranging an aluminum foil in a space containing a hydrocarbon-containing substance and a step of heating the aluminum foil.

5 Claims, 2 Drawing Sheets

1 μm

1 μm

1 μm

1 μm

FOIL FOR NEGATIVE ELECTRODE OF CAPACITOR AND PROCESS FOR PRODUCING THE SAME

TECHNICAL FIELD

This invention relates to a foil for a cathode of a capacitor, and a manufacturing method thereof. More particularly, this invention relates to a foil for a cathode of a capacitor, which uses an aluminum foil as a base material, and a manufacturing method thereof

BACKGROUND ART

A capacitor includes two electrodes: an anode and a cathode. As a material of the anode, there is used a valve metal such as aluminum or tantalum which allows an insulating oxide film to be generated on a surface. As a material of the cathode, there is used any of an electrolytic solution, an inorganic semiconductor, an organic conductive material and a metal thin film. When the material of the cathode is an electrolytic solution, an aluminum foil having an enlarged surface area is frequently used for a cathode terminal. An aluminum foil of this type is called an electrolytic capacitor cathode aluminum foil. The surface area of the cathode aluminum foil is enlarged to increase the capacitance of a capacitor.

A manufacturing process of a capacitor involves a step of cutting a cathode aluminum foil supplied in the form of a coil into a predetermined width, a step of coiling the slit coil-shaped cathode aluminum foil which has been cut, and a step of coiling the cathode aluminum foil in order to finally constitute a cylindrical capacitor or a step of cutting the cathode aluminum foil in order to constitute a laminate-type capacitor.

In order to improve productivity in these steps, it is required to raise the rate of coiling the cathode aluminum foil. To meet this demand, it is necessary to improve the mechanical strength of the cathode aluminum foil, that is, the tensile strength of the cathode aluminum foil.

As mentioned above, the cathode aluminum foil requires a high tensile strength as well as a high capacitance as necessary requirements.

For increasing the capacitance of the cathode aluminum foil, there is generally adopted a method of enlarging the surface area of the aluminum foil by etching. The etching, however, significantly reduces the tensile strength of the aluminum foil.

There is a current need for developing a smaller capacitor along with the development of small-sized electric apparatuses. To make a capacitor small, the thickness of the cathode aluminum foil must be made more small. If the thickness of the aluminum foil is made thin, the strength of the aluminum foil is relatively dropped.

Also, as the capacitor cathode aluminum foil, one having an aluminum purity of about 99.0 to 99.95% by mass is usually used to control the reaction when carrying out etching to enlarge the surface area of the aluminum foil. The purity (base purity) of aluminum herein means a value obtained by subtracting the content of major three elements, i.e., iron, silicon and copper, included in the aluminum foil from 100%.

In this situation, there is proposed a manufacturing method for improving the capacitance and strength of an electrolytic capacitor cathode aluminum foil in, for example, Japanese Unexamined Patent Publication No. 05-247609. In this manufacturing method of the electrolytic capacitor cathode aluminum foil, an aluminum material having a chemical composition in which the purity of aluminum is 99.8% or more, the contents of Fe and Si are respectively limited to 0.05% or less and the content of Cu is limited to 0.005% or less and the content of Mg and the content of Zn are adjusted so as to satisfy a predetermined equation, is subjected to soaking treatment at 540° C. or less, hot-rolled and then subjected to coiling which is finished at a temperature of 300° C. or less, and is finally subjected to cold rolling carried out at a working ratio of 95% or more to make the product foil have the specified thickness. This aluminum foil is etched to enlarge the surface area.

However, even if the foregoing manufacturing method disclosed in Japanese Unexamined Patent Publication No. 05-247609 is used, it is limited in its capability of improving the capacitance of a capacitor without any reduction in tensile strength as to the requirements satisfied by the capacitor cathode aluminum foil.

DISCLOSURE OF THE INVENTION

It is an object of this invention to provide a foil for a cathode of a capacitor, that can secure a high capacitance and a high strength, and a manufacturing method thereof.

The inventors of this invention have made earnest studies to solve problems about the background art and, as a result, have found that a foil for a cathode of a capacitor, that can attain the above object, can be obtained by subjecting an aluminum foil to specific treatment. The present invention has been thus completed based on the findings of the inventors.

A foil for a cathode of a capacitor according to this invention includes an aluminum foil and a carbon-containing layer formed on the surface of the aluminum foil. An interposition layer containing aluminum and carbon is formed between the aluminum foil and the carbon-containing layer.

In the foil for a cathode of a capacitor according to this invention, the carbon-containing layer has the effect of enlarging or increasing the surface area of the aluminum foil without any reduction in the strength of the aluminum foil. This increases the capacitance of the foil for a cathode of a capacitor. In addition, since the interposition layer containing aluminum and carbon is formed between the aluminum foil and the carbon-containing layer, this interposition layer has the effect of improving the adhesion between the aluminum foil and the carbon-containing layer that increases the surface area of the aluminum foil. A predetermined capacitance and a predetermined strength can be thereby secured.

In the foil for a cathode of a capacitor according to this invention, preferably, the carbon-containing layer includes therein an interposition material containing aluminum and carbon.

When the carbon-containing layer is thin, the adhesion between the aluminum foil and the carbon-containing layer can be improved only by the presence of the interposition layer. However, when the carbon-containing layer is thick, separation inside the carbon-containing layer occurs; therefore, there is a possibility that a predetermined capacitance cannot be obtained. In this case, if the interposition material containing aluminum and carbon is formed inside the carbon-containing layer, the adhesion in the carbon-containing layer can be raised, making it possible to secure a predetermined capacitance.

In the foil for a cathode of a capacitor according to this invention, preferably, the carbon-containing layer is formed so as to extend outward from the surface of the aluminum foil. In this case, the carbon-containing layer exhibits the effect of enlarging or increasing the surface area of the aluminum foil more effectively.

In the foil for a cathode of a capacitor according to this invention, preferably, the interposition layer constitutes a first surface portion which is formed in at least a part of the surface of the aluminum foil and contains a carbide of aluminum. Also preferably, the carbon-containing layer constitutes a second surface portion which is formed so as to extend outward from the first surface portion.

In this case, the second surface portion has the effect of increasing the surface area of the aluminum foil without any reduction in the strength of the aluminum foil. The capacitance of the foil for a cathode of a capacitor is thereby increased. Further, since the first surface portion containing a carbide of aluminum is formed between the aluminum foil and the second surface portion, this first portion has the effect of improving the adhesion between the aluminum foil and the second surface portion that increases the surface area of the aluminum foil. It is thereby possible to secure a predetermined capacitance and a predetermined strength.

A manufacturing method of a foil for a cathode of a capacitor according to this invention includes a step of arranging an aluminum foil in a space containing a hydrocarbon-containing substance, and a step of heating the aluminum foil.

In the manufacturing method according to this invention, an interposition material containing aluminum and carbon can be formed and a carbon-containing layer having the effect of increasing the surface area of the aluminum foil can be easily formed on the surface of the aluminum foil by heating the aluminum foil arranged in a space containing a hydrocarbon-containing substance.

In the manufacturing method of a foil for a cathode of a capacitor according to this invention, preferably, the step of disposing the aluminum foil involves adhering at least one kind selected from the group consisting of a carbon-containing substance and an aluminum powder to a surface of the aluminum foil and, then, arranging the aluminum foil in a space containing a hydrocarbon-containing substance.

When the aluminum foil arranged in a space containing a hydrocarbon-containing substance is heated, a foil for a cathode of a capacitor provided with a capacitance and a strength higher than that of a conventional one can be obtained. However, in the case of obtaining a foil for a cathode of a capacitor having an outstandingly higher capacitance, it is preferable to adhere at least one kind selected from the group consisting of a carbon-containing substance and an aluminum powder to a surface of the aluminum foil, then, arrange the aluminum foil in a space containing a hydrocarbon-containing substance, and heat the aluminum foil.

It is preferable that the manufacturing method of a foil for a cathode of a capacitor according to this invention further includes a step of rolling the heated aluminum foil.

In the manufacturing method of a foil for a cathode of a capacitor according to this invention, the step of heating the aluminum foil is preferably carried out within a temperature range between 450° C. or more and less than 660° C.

According to this invention, as mentioned above, it is possible to obtain a foil for a cathode of a capacitor capable of securing a high capacitance and a high strength.

BEST MODE FOR CARRYING OUT THE INVENTION

Figure 1:
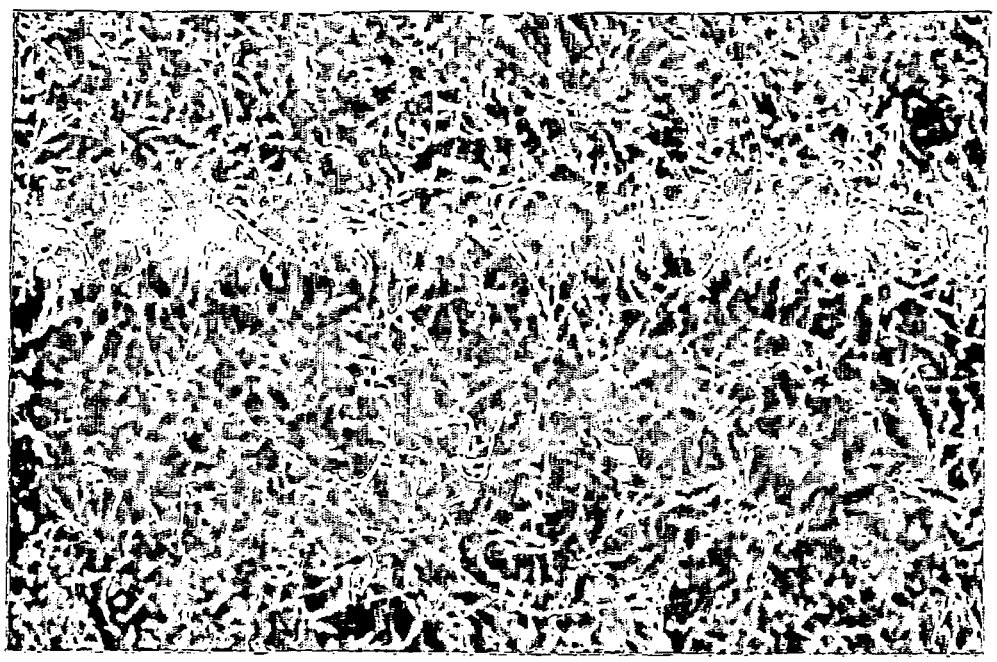
FIG. 1 shows a scanning-type electron microphotograph of a sample of Example 1.

The inventors of this invention have found that when an aluminum material is heated in the presence of a hydrocarbon-containing substance, a crystal of aluminum carbide is formed as a first surface portion in the vicinity of the surface of the aluminum material and a second surface portion is formed at a high density so as to extend outward the surface of the aluminum material from the crystal of aluminum carbide. The inventors of this invention have also found that heating of the aluminum material brings about the characteristics that the formed second surface portion is firmly bound internally or with other carbon-containing substance firmly to form an aluminum foil having a larger surface area. The present invention was thus completed.

The aluminum material produces the above effect in any of a plate shape, a foil shape and a powder shape; however, an aluminum material having a foil shape is used for a cathode of a capacitor.

The second surface portion according to one embodiment of this invention extends outward from the first surface portion containing a carbide of aluminum, and is preferably present in a filament form, a fibrous form or a cactus form so that it has a large surface area, which has the effect of increasing the surface area of the aluminum foil. As a result, the capacitance of the foil for a cathode of a capacitor is increased.

In one embodiment of this invention, the first surface portion containing a crystal of aluminum carbide is formed between the aluminum foil and the second surface portion; therefore, this first portion has the effect of improving the adhesion between the aluminum foil and the second surface portion that increases the surface area of the aluminum foil. This ensures that a predetermined capacitance and a predetermined strength can be secured.

In one embodiment of this invention, the second surface portion is internally bound firmly; therefore, it is possible to obtain an aluminum foil having a larger surface area by utilizing an aluminum powder.

Furthermore, in one embodiment of this invention, the second surface portion is firmly bound with a carbon-containing substance different therefrom; therefore, it is possible to obtain an aluminum foil having a larger surface area by utilizing a carbon-containing substance having a large surface area such as activated carbon.

In one embodiment of this invention, the second surface portion is firmly bound internally or with a carbon-containing substance different therefrom; therefore, it is possible to obtain an aluminum foil having a larger surface area by utilizing an aluminum powder and a carbon-containing substance.

In the case of the foil for a cathode of a capacitor according to this invention, any method of increasing or enlarging the surface area by etching treatment is not adopted; therefore, it is unnecessary to limit the purity of the aluminum foil to about 99.0 to 99.5% by mass to control reactivity with an etchant. As to the thickness of the aluminum foil, an aluminum foil having a thickness of about 1 to 200 μm may be used though the thickness may be properly determined based on the strength required for the aluminum foil and the necessity for developing a small-sized capacitor.

In one embodiment of the manufacturing method of a foil for a cathode of a capacitor according to this invention, no particular imitation is imposed on the kind of a hydrocarbon-containing substance to be used. Examples of the kind of a hydrocarbon-containing substance include paraffin-type hydrocarbons such as methane, ethane, propane, n-butane, isobutane and pentane, olefin-type hydrocarbons such as ethylene, propylene, butene and butadiene, acetylene-type hydrocarbons such as acetylene or derivatives of these hydrocarbons. Among these hydrocarbons, paraffin-type hydrocarbons such as methane, ethane and propane are gasified in the step of heating the aluminum foil and are therefore preferable. Any one of hydrocarbons such as methane, ethane and propane is more preferable. Methane in the hydrocarbons is most preferable.

In addition, the hydrocarbon-containing substance may be used in any of a solid state, a liquid state and a gas state in the manufacturing method according to this invention. It is only required for the hydrocarbon-containing substance to be present in a space where the aluminum foil is present and any method may be used to introduce the hydrocarbon-containing substance into a space where the aluminum foil is arranged. When the hydrocarbon-containing substance has a gas state (e.g., methane, ethane or propane), it may be filled either singly or in combination with an inert gas in a sealed space where the aluminum foil is treated under heating. Also, when the hydrocarbon-containing substance has a solid or liquid state, it may be filled either singly or in combination with inert gas in a manner that it is gasified in a sealed space.

There is no particular limitation to the pressure in a heating atmosphere in the step of heating the aluminum foil and the heating may be carried out under normal pressure or reduced pressure or under pressure. Also, the pressure may be adjusted at any time when the atmosphere is kept at a constant temperature, when the atmosphere is raised to a prescribed temperature and when the atmosphere is dropped from a prescribed temperature.

Although no particular limitation is imposed on the weight ratio of the hydrocarbon-containing substance to be introduced in a space where the aluminum foil is arranged, the weight ratio is preferably within a range between 0.1 parts by weight or more and 50 parts by weight or less, particularly preferably between 0.5 parts by weight or more and 30 parts by weight or less, in terms of carbon with respect to 100 parts by weight of the aluminum foil.

In the step of heating the aluminum foil, the heating temperature is preferably within a range between 450° C. or more and less than 660° C., more preferably between 500° C. or more and 630° C. or less, still more preferably between 570° C. or more and 630° C. or less, though it may be properly set in accordance with the composition of the aluminum foil to be heated. However, the manufacturing method according to this invention does not exclude the case where the aluminum foil is heated at a temperature less than 450° C. and it is only required for the aluminum foil to be heated at a temperature at least exceeding 300° C.

The heating time is, though depending on, for example, heating temperature, generally within a range between 1 hour or more and 100 hours or less.

When the heating temperature is 400° C. or more during the course including a temperature-rise step and a temperature-drop step, the concentration of oxygen in a heating atmosphere is preferably made to be 1.0% by volume or less. When the heating temperature is 400° C. or more and the concentration of oxygen in a heating atmosphere exceeds 1.0% by volume, a thermally oxidized film on the surface of the aluminum foil is made large and there is therefore a fear that the boundary electric resistance at the surface of the aluminum foil is increased.

Also, the surface of the aluminum foil may be roughened prior to heat treatment. There is no particular limitation to the surface rouging method and known techniques such as washing, etching and blasting may be used.

The aluminum foil for a cathode of a capacitor may be rolled after heat treatment so as to have a desired thickness and hardness.

In order to more increase or enlarge the surface area of the aluminum foil by using the manufacturing-method according to the present invention, a step is adopted in which at least one of a carbon-containing substance and an aluminum powder is adhered to the surface of the aluminum foil and, then, the aluminum foil is arranged in a space containing a hydrocarbon-containing substance. At this time, the second surface portion to be formed on the surface of the aluminum foil is constituted of a portion which extends outward from the first surface portion containing a carbide of aluminum and is present in a filament form, a fibrous form or a cactus form, and a large number of particle portions adhered onto the above portion.

In this case, as the carbon-containing substance, any of an active carbon fiber, active carbon cloth, active carbon felt, active carbon powder, Indian ink, carbon black and graphite may be used. At to the adhering method, the carbon-containing substance prepared in the form of a slurry, a liquid or a solid by using a binder, a solvent or water may be adhered onto the surface of the aluminum foil by application, dipping or thermal and pressure bonding. After the carbon-containing substance is adhered onto the surface of the aluminum foil, it may be dried at a temperature within a range between 20° C. or more and 300° C. or less.

Also, a step of arranging the aluminum foil in a space containing a hydrocarbon-containing substance is adopted after a carbon-containing substance is adhered onto the surface of the aluminum foil, and then activating treatment for increasing the surface area of the carbon-containing substance adhered to the aluminum foil may be carried out. The activating treatment may be carried out as follows: at a temperature within a range between 50° C. or more and 600° C. or less, preferably between 200° C. or more and 500° C. or less, the aluminum foil is arranged in a space containing 2 to 50% by volume of oxygen. The activating treatment time is, though depending on the temperature, generally within a range between 10 seconds or more and 100 hours or less. This activating treatment may be repeated.

As the aluminum powder, any of an aluminum powder having an amorphous, spherical or flat form or an aluminum paste may be used. As to a method of adhering the aluminum powder, the aluminum powder prepared in the form of a slurry, liquid or solid by using a binder or a solvent may be adhered onto the surface of the aluminum foil by application, dipping or thermal and pressure bonding.

EXAMPLES

Foils for a cathode of a capacitor were fabricated in the following Examples 1 to 10 and a conventional example. For comparison with Examples 1 to 10, a foil for a cathode of a capacitor according to a reference example was fabricated.

Example 1

An aluminum foil having a thickness of 30 μm (JIS A1050-H18) was kept at 590° C. for 10 hours in an acetylene gas atmosphere. Then, when the surface of the sample was observed by a scanning electron microscope (SEM), the existence of a carbon-containing layer was confirmed, the carbon-containing layer being constituted of a portion extending outward in a fibrous form or a filament form about 1000 nm in length from the surface of the aluminum foil. This scanning electron microphotograph is shown in FIG. 1. Also, the presence of aluminum carbide was confirmed by X-ray analysis and an electron energy loss spectrometer (EELS).

Example 2

2 Parts by weight of carbon black having an average particle diameter of 0.5 μm was mixed with 1 part by weight of a vinyl chloride binder and the mixture was dispersed in a solvent (toluene) to obtain a coating solution having a solid content of 30%. This coating solution was applied to both surfaces of an aluminum foil having a thickness of 30 μm (JIS A1050-H18) and dried. The thickness of the dried coating film on one surface was 1 μm. This aluminum foil was kept at 590° C. for 10 hours in a methane gas atmosphere. Then, when the surface of the sample was observed by a scanning electron microscope (SEM), the existence of a carbon-containing layer was confirmed, the carbon-containing layer being constituted of a portion extending outward in a fibrous form or a filament form about 1000 nm in length from the surface of the aluminum foil and a large number of particle portions having a particle diameter of about 0.5 μm which particle portions were adhered onto the surface of the above portion. Also, the presence of aluminum carbide was confirmed by X-ray analysis and an electron energy loss spectrometer (EELS).

Example 3

Figure 2:
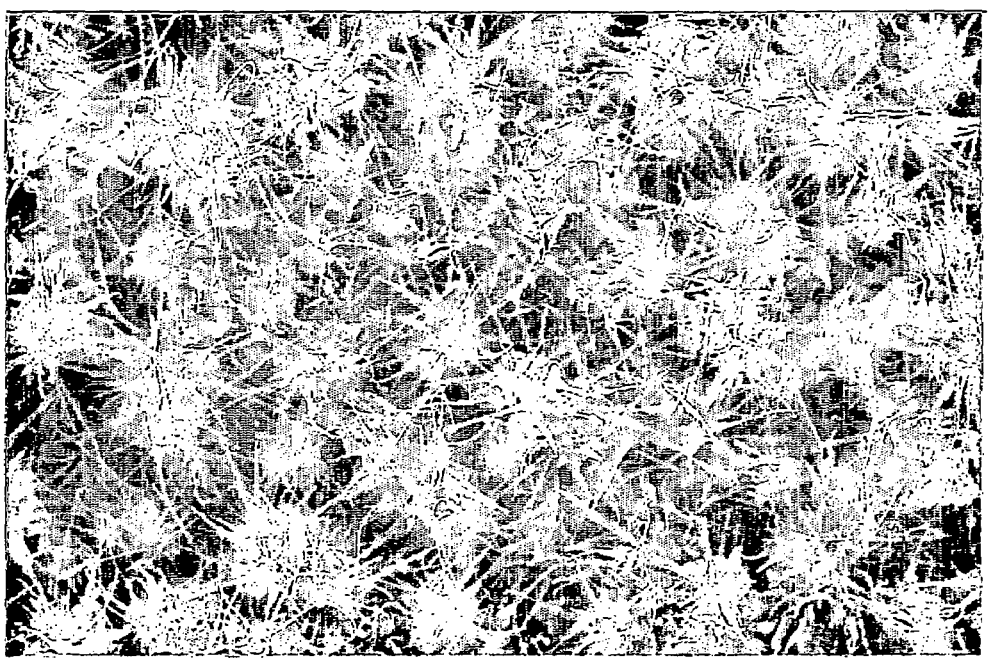
FIG. 2 shows a scanning-type electron microphotograph of a sample of Example 3.

2 Parts by weight of an aluminum powder having an average particle diameter of 1 μm was mixed with 1 part by weight of a vinyl chloride binder and the mixture was dispersed in a solvent (toluene) to obtain a coating solution having a solid content of 30%. This coating solution was applied to both surfaces of an aluminum foil having a thickness of 15 μm (JIS 1N30-H18) and dried. The thickness of the dried coating film on one surface was 2 μm. This aluminum foil was kept at 620° C. for 10 hours in a methane gas atmosphere. Then, when the surface of the sample was observed by a scanning electron microscope (SEM), the existence of a carbon-containing layer was confirmed, the carbon-containing layer being constituted of a portion extending outward in a cactus form about 5000 nm in length from a number of particle portions about 1 μm in particle diameter which particle portions were adhered onto the surface of the aluminum foil. This scanning electron microphotograph is shown in FIG. 2. Also, the presence of aluminum carbide was confirmed by X-ray analysis and an electron energy loss spectrometer (EELS).

Examples 4 to 10

Figure 3:
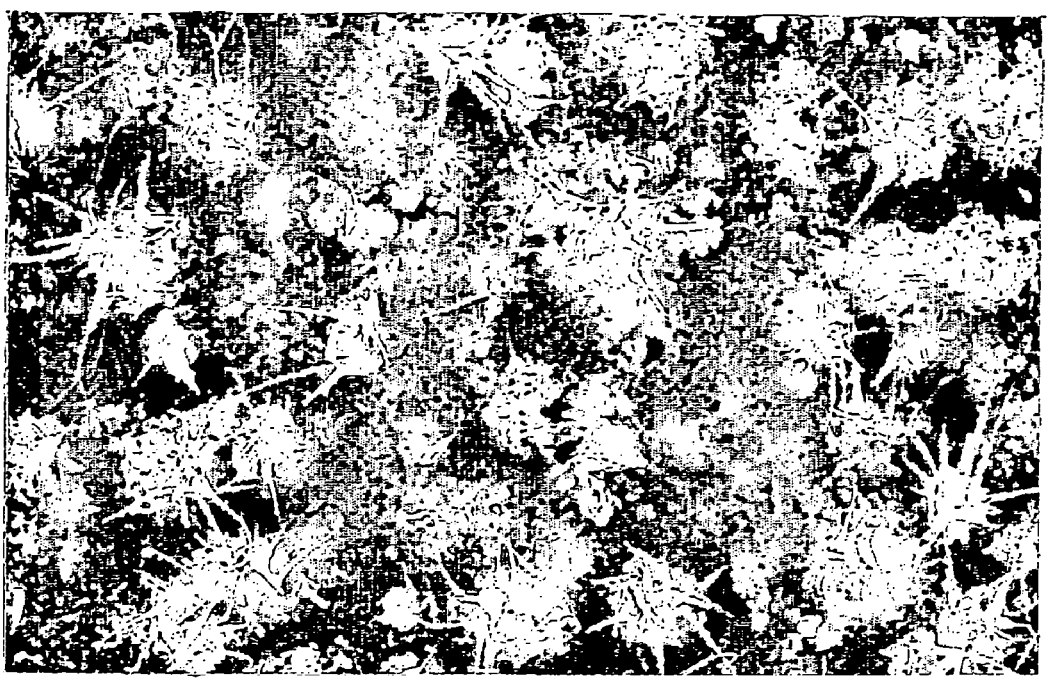
FIG. 3 shows a scanning-type electron microphotograph of a sample of Example 6.

2 Parts by weight of carbon black having an average particle diameter of 0.1 μm and 2 parts by weight of an aluminum powder having an average particle diameter of 1 μm were mixed with 1 part by weight of a vinyl chloride binder and the mixture was dispersed in a solvent (toluene) to obtain a coating solution having a solid content of 30%. This coating solution was applied to both surfaces of an aluminum foil having a thickness of 12 μm (JIS A3003-H18) and dried. The thickness of the dried coating film on one surface was 4 μm. This aluminum foil was subjected to heat treatment under the conditions shown in Table 1. In Example 8, the aluminum foil was subjected to rolling treatment carried out using a rolling roll at a reduction ratio of about 20% after the heat treatment. In Example 10, the aluminum foil was subjected to activating treatment carried out at 300° C. for 2 hours in the air after the heat treatment. Then, when the surface of the sample was observed by a scanning electron microscope (SEM), the existence of a carbon-containing layer was confirmed, the carbon-containing layer being constituted of a portion extending outward in a cactus form from a large number of particle portions having a particle diameter of about 1 μm which particles portions were adhered onto the surface of the aluminum foil and a large number of particle portions having a particle diameter of about 0.1 μm which particle portions were adhered onto the surface of the above portion. The scanning electron microphotograph of Example 6 is shown in FIG. 3. Also, the presence of aluminum carbide was confirmed by X-ray analysis and an electron energy loss spectrometer (EELS).

TABLE 1

| | Heat treatment | | |
| --- | --- | --- | --- |
| | Atmosphere | Temperature (° C.) | Time (Hr) |
| Example 4 | Acetylene gas | 440 | 60 |
| Example 5 | Acetylene gas | 490 | 10 |
| Example 6 | Methane gas | 540 | 10 |
| Example 7 | Methane gas | 590 | 10 |
| Example 8 | Methane gas | 590 | 10 |
| Example 9 | Methane gas | 640 | 10 |
| Example 10 | Methane gas | 540 | 10 |

2 Parts by weight of carbon black having an average particle diameter of 0.1 μm and 2 parts by weight of an aluminum powder having an average particle diameter of 1 μm were mixed with 1 part by weight of a vinyl chloride binder and the mixture was dispersed in a solvent (toluene) to obtain a coating solution having a solid content of 30%. This coating solution was applied to both surfaces of an aluminum foil having a thickness of 12 μm (JIS A3003-H18) and dried. The thickness of the dried coating film on one surface was 4 μm. This aluminum foil was dried at 500° C. in an argon gas atmosphere. Then, when the surface of the sample was observed by a scanning electron microscope (SEM), no carbon-containing layer was formed on the surface of the aluminum foil in the condition that it was adhered onto the surface of the aluminum foil, the portions where the coating film was separated and fallen down were observed and the presence of a portion extending outward in a fibrous form, a filament form or a cactus form from the surface was not confirmed. Also, the presence of aluminum carbide was not confirmed by X-ray analysis and an electron energy loss spectrometer (EELS).

Conventional Example

An aluminum foil having a thickness of 40 μm (JIS A1080-H18) was subjected to a.c. etching treatment carried out at 50° C. and a current density of 0.4 A/cm² for 60 seconds in an electrolytic solution containing 15% of hydrochloric acid and 0.5% of sulfuric acid and the etched aluminum foil was washed with water and dried.

The characteristics of the respective samples obtained in Examples 1 to 10, the reference example and the conventional example were measured in the following manner.

(1) Thickness

The thickness of each sample was measured on an optical and sectional microphotograph taken at a magnification of 100. The results of measurement are shown in Table 2.

(2) Capacitance

The capacitance of each sample was measured by a LCR meter in an aqueous ammonium borate solution (8 g/L).

(3) Mechanical Strength

The mechanical strength of each sample was evaluated by a tensile test. Specifically, using an Instron type tensile tester, a sample having a width of 15 mm was stretched at a tensile rate of 10 mm/min to calculate the tensile strength of the sample from the obtained thickness of the sample.

The capacitance and tensile strength of each sample measured in the above manner are expressed by indexes when the values of these characteristics obtained in the conventional example were respectively set to 100. The results are shown in Table 2.

TABLE 2

| | Thickness of sample (μm) | Capacitance (%) | Tensile strength (%) |
|---|---|---|---|
| Example 1 | 32 | 112 | 195 |
| Example 2 | 32 | 196 | 208 |
| Example 3 | 18 | 155 | 212 |
| Example 4 | 20 | 103 | 269 |
| Example 5 | 20 | 109 | 254 |
| Example 6 | 20 | 327 | 237 |
| Example 7 | 20 | 948 | 197 |
| Example 8 | 16 | 1030 | 523 |
| Example 9 | 20 | 914 | 180 |
| Example 10 | 20 | 603 | 227 |
| Reference example | 20 | 11 | 252 |
| Conventional example | 38 | 100 | 100 |

As is clarified from these results of measurement, the samples of Examples 1 to 10 respectively have an enlarged surface area and therefore have a higher capacitance and a higher tensile strength than the sample of the conventional example. The sample of the reference example has a higher tensile strength but a lower capacitance than the sample of the conventional example.

The above disclosed embodiments and examples are illustrative in all points and are not to be considered to be restrictive. The scope of the present invention is defined by the appended claims rather than by the above embodiments and examples and all variations and modifications within the scope of the claims and within the meaning of equivalence are involved.

INDUSTRIAL APPLICABILITY

The foil for a cathode of a capacitor according to the present invention is suitable for securing both a high capacitance and a high strength.

The invention claimed is:

1. A foil for a cathode of a capacitor, comprising:
   an aluminum foil;
   a carbon-containing layer formed on a surface of said aluminum foil; and
   an interposition layer that is formed between said aluminum foil and said carbon-containing layer and contains aluminum and carbon, wherein
   said carbon-containing layer is formed so as to extend outward from the surface of said aluminum foil.

2. The foil for a cathode of a capacitor according to claim 1, wherein said carbon-containing layer includes therein an interposition material containing aluminum and carbon.

3. The foil for a cathode of a capacitor according to claim 1, wherein
   said interposition layer constitutes a first surface portion that is formed on at least a part of the surface of said aluminum foil and contains a carbide of aluminum, and
   said carbon-containing layer constitutes a second surface portion that is formed so as to extend outward from said first surface portion.

4. A manufacturing method of a foil for a cathode of a capacitor, comprising the steps of:
   arranging an aluminum foil in a space containing a hydrocarbon-containing substance; and
   heating said aluminum foil,
   wherein said step of arranging the aluminum foil involves adhering at least one kind selected from the group consisting of a carbon-containing substance and an aluminum powder to a surface of the aluminum foil, and then arranging the aluminum foil in a space containing a hydrocarbon-containing substance.

5. The manufacturing method of a foil for a cathode of a capacitor according to claim 4, wherein said step of heating the aluminum foil is carried out within a temperature range between 450° C. or more and less than 660° C.

* * * * *